United States Patent [19]

Noda et al.

[11] Patent Number: 4,623,563
[45] Date of Patent: Nov. 18, 1986

[54] PROCESS FOR PRODUCING POLYIMIDE/METALLIC FOIL COMPOSITE FILM

[75] Inventors: Yuzuru Noda, Osaka; Masanori Imai, Fukui, both of Japan

[73] Assignee: Nitto Electric Industrial Co., Ltd., Osaka, Japan

[21] Appl. No.: 716,313

[22] Filed: Mar. 27, 1985

[30] Foreign Application Priority Data

Mar. 31, 1984 [JP] Japan .................. 59-64224

[51] Int. Cl.$^4$ .......................... H05K 1/03
[52] U.S. Cl. ..................... 427/379; 427/96; 427/388.1; 427/388.2; 428/901
[58] Field of Search ............... 427/96, 388.1, 388.2, 427/379

[56] References Cited

U.S. PATENT DOCUMENTS

| | | | |
|---|---|---|---|
| 3,981,847 | 9/1976 | Meyer | 528/351 |
| 4,411,952 | 10/1983 | Sasaki | 427/388.1 |
| 4,440,643 | 4/1984 | Makino | 427/379 |
| 4,470,944 | 9/1984 | Asakura | 428/473.5 |
| 4,503,285 | 3/1985 | Darms | 427/96 |
| 4,508,766 | 4/1985 | Inaike | 427/96 |
| 4,522,880 | 6/1985 | Klostermeier | 428/473.5 |

*Primary Examiner*—John D. Smith
*Attorney, Agent, or Firm*—Sughrue, Mion, Zinn, Macpeak, and Seas

[57] ABSTRACT

A process for producing a polyimide/metallic foil composite film having a curvature radius of at least 25 cm and which is substantially free from curling is described, comprising coating a solution of a polyimide precursor in an organic polar solvent on a 1 to 500 μm thick metallic foil, the polyimide precursor being prepared by reacting a diamine component comprising p-phenylenediamine and an aromatic tetracarboxylic acid component comprising 3,3',4,4'-biphenyltetracarboxylic dianhydride or its derivative; heat-drying the above-prepared coating in the state that the metallic foil is fixed; and then heating it at a high temperature to form a 5 to 200 μm thick polyimide film. This composite film does not substantially curl in either the lengthwise and widthwise directions and is very suitable for use in the production of an electric circuit board.

14 Claims, 1 Drawing Figure

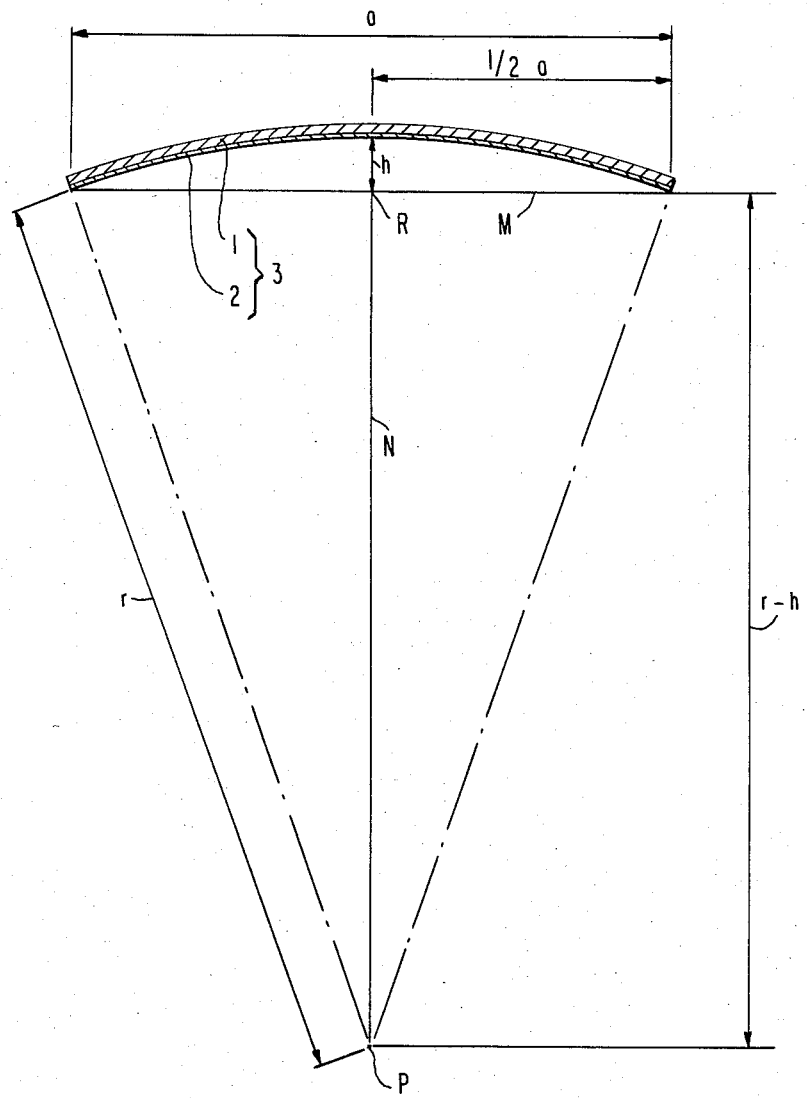

PROCESS FOR PRODUCING POLYIMIDE/METALLIC FOIL COMPOSITE FILM

FIELD OF THE INVENTION

The present invention relates to a process for producing a polyimide/metallic foil composite film.

BACKGROUND OF THE INVENTION

A composite film comprising a metallic foil with a polyimide layer laminated thereon is useful for an electric circuit board. Such composite films have been produced by the following procedures: (A) a method comprising bonding a polyimide film to a metallic foil through an adhesive; (B) a method comprising heat-bonding a polyimide film to a metallic foil; and (C) a method comprising applying a solution of a polyimide precursor in an organic polar solvent onto a metallic foil, drying the coating and imidating the polyimide precursor to form a polyimide layer.

The method (C) has several advantages as compared to the methods (A) and (B), such as that the process can be simplified because it is not necessary to form a film in advance as in the methods (A) and (B), a thin composite film can be produced, and the process is free from troubles due to the use of an adhesive as in the method (A). In the method (C), however, the coating shrinks when cooled after heating for drying or imidating, and curling occurs in composite films thus produced because it is difficult for the metallic foil to conform to the shrinkage of the coating. Thus, the composite films of method (C) have a disadvantage in that they cannot be used in the preparation of electric circuits, or that they are not convenient to use for such preparation.

SUMMARY OF THE INVENTION

Extensive investigations have been made to overcome the above-described problems.

Accordingly, an object of the present invention is to provide a process for producing a polyimide/metallic foil composite film which is substantially free from curling without requiring the formation of the polyimide films in advance.

The process for producing a polyimide/metallic foil composite film according to the present invention comprises:

coating a solution of a polyimide precursor in an organic polar solvent onto a metallic foil having a thickness of from 1 to 500 μm, the polyimide precursor being prepared by reacting a diamine component comprising p-phenylenediamine with an aromatic tetracarboxylic acid component comprising 3,3',4,4'-biphenyltetracarboxylic dianhydride or a derivative thereof, drying the above-prepared coating by heating in the state that the metallic foil is fixed, and heating the coating at a high temperature to form a polyimide film having a thickness of from 5 to about 200 μm.

Thereby there is obtained a polyimide/metallic foil composite film having a curvature radius of 25 cm or more and which is substantially free from curling in the lengthwise and widthwise directions.

BRIEF DESCRIPTION OF THE DRAWING

The drawing illustrates a cross-section view of a polyimide/metallic foil composite film, which is provided to explain the curvature radius.

DETAILED DESCRIPTION OF THE INVENTION

The process of the present invention can produce a polyimide/metallic foil composite film having a curvature radius of 25 cm or more which is substantially free of curling in both the lengthwise and widthwise directions. The reasons that such a composite film can be produced are that the polyimide coating prepared from the above-specified diamine and aromatic tetracarboxylic acid components has a coefficient of linear thermal expansion which is nearly equal to that of a metallic foil comprising, for example, copper or aluminum, and that, in the formation of the polyimide coating on the metallic foil, a heat-drying process and a high-temperature heating process including imidation are carried out in the state that the metallic foil is fixed; in particular, the high-temperature heating process releases the stress formed in the polyimide layer.

The composite film produced by the process of the present invention can be used as substrates for the production of electric circuit boards without any problems. The composite film has the advantage that the handling properties in processing the circuits are excellent. Another advantage is that the electric circuit boards obtained are resistant to curling due to temperature changes, and therefore the boards have excellent dimensional stability.

The term "curvature radius" as used herein is described below. The drawing shows a cross-sectional view of a polyimide/metallic composite film 3 comprising a metallic foil 1 and a polyimide coating 2. This composite film 3 has a length of 10 cm and a width of 10 cm. When the composite film 3 curls in the widthwise (or lengthwise) direction, the curvature radius is defined as a radius r, a distance from a central point P. Assuming that a distance from a point R to the center of the composite film 3 when it curls is h, if the distance h is equal to or larger than the radius r, i.e., $h \geq r$, the curvature radius is determined by actually measuring the radius r. The symbol M indicates a horizontal line connecting the both extremities of the composite film 3 in the curled condition, and the length of the horizontal line M is represented by a. The symbol N indicates a perpendicular line relative to the horizontal line M and crosses with the horizontal line M at the point R. On the other hand, if $h < r$, the curvature radius is determined by actually measuring the distance h and the length a, and then calculating from the following equation.

$$r^2 = (r-h)^2 + (\tfrac{1}{2}a)^2$$

$$r^2 = r^2 - 2rh + h^2 + (\tfrac{1}{2}a^2)$$

$$2rh = h^2 + (\tfrac{1}{2}a^2)$$

$$r = \tfrac{1}{2}h + \tfrac{1}{8} \cdot \frac{a^2}{h}$$

The composite film of the present invention has the relationship of $h < r$ and $r = 25$ cm or more, preferably at least 50 cm, and more preferably ∞. That is, the present invention provides a composite film substantially free from curling.

The diamine component which can be used to prepare the polyimide precursor or polyimide comprises p-phenylenediamine. The preferred diamine component comprises 80 mol% or more of p-phenylenediamine and 20 mol% or less of other diamines. If the proportion of p-phenylenediamine is too small, the difference in coefficient of linear thermal expansion between the polyimide layer and the metallic foil comprising, for example, copper or aluminum increases, which is undesirable.

Other diamines which can be used include 4,4'-diaminodiphenyl ether, 4,4'-diaminodiphenylmethane, 4,4'-diaminodiphenylsulfone, 3,3'-diaminodiphenylsulfone, m-phenylenediamine, 4,4'-diaminodiphenylpropane, 1,5-diaminonaphthalene, 2,6-diaminonaphthalene, 4,4'-diaminodiphenyl sulfide, 4,4'-di(m-aminophenoxy)-diphenylsulfone, 3,3'-di(m-aminophenoxy)diphenylsulfone, and 4,4'-di(m-aminophenoxy)diphenylpropane. These compounds can be used alone or as mixtures thereof. Several mol% of diaminosiloxane may be used.

The aromatic tetracarboxylic acid component which can be used to prepare the polyimide precursor comprises 3,3',4,4'-biphenyltetracarboxylic dianhydride or its derivative such as acid halide, diester, and monoester. The preferred aromatic tetracarboxylic acid component comprises 70 mol% or more of the above dianhydride or derivative and 30 mol% or less of other aromatic tetracarboxylic dianhydrides or their derivatives such as acid halides, diesters, and monoesters. If the proportion of 3,3',4,4'-biphenyltetracarboxylic dianhydride or its derivative is too small, various problems undesirably occur such that the difference in coefficient of linear thermal expansion between the polyimide layer and the metallic foil increases, or the strength of the coating deteriorates remarkably.

Other aromatic tetracarboxylic dianhydrides and their derivatives which can be used include pyromellitic dianhydride, 3,3',4,4'-benzophenonetetracarboxylic dianhydride, and 2,3,6,7-naphthalenetetracarboxylic dianhydride, and their derivatives. These compounds can be used alone or as mixtures thereof. Of these compounds pyromellitic dianhydride and its derivatives, and 3,3',4,4'-benzophenonetetracarboxylic dianhydride and its derivatives are preferably used. The reason for this is that even if they are reacted alone with the above-specified diamine component, it is difficult to produce a polyimide coating having an excellent coating strength, but good results can be obtained in reducing the coefficient of linear thermal expansion, and this is particularly suitable for the object of the present invention of preventing curling.

In preparing the polyimide precursor such as polyamide acid, preferably approximately equimolar amounts of the diamine and aromatic tetracarboxylic acid components are reacted in an organic polar solvent at 0° to 90° C. for 1 to 24 hours.

Organic polar solvents which can be used for this purpose include N-methyl-2-pyrrolidone, N,N-dimethylacetamide, N,N-dimethylformamide, dimethylsulfoxide, dimethylphosphoamide, m-cresol, p-cresol, and p-chlorophenol. In addition, solvents such as xylene, toluene, hexane, and naphtha may be used in combination with the above solvents.

The polyimide precursor thus-prepared preferably has a logarithmic viscosity (measured at 30° C. in N-methyl-2-pyrrolidone at a concentration of 0.5 g/100 ml) of from 0.4 to 7.0 and preferably from 1.5 to 3.0. If the logarithmic viscosity is too small, the polyimide coating has a low mechanical strength. On the other hand, if it is too large, the coating workability on the metallic foil is poor.

According to the process for producing the composite film of the present invention, a solution of the polyimide precursor in the organic polar solvent is heated to a temperature of 80° C. or less to decrease its viscosity, and then is flow coated onto the metallic foil, which has a thickness of from 1 to 500 μm, preferably from 10 to 100 μm, and more preferably from 20 to 50 μm, by a suitable means such as use of an applicator which can adjust the coating thickness. If the thickness of the metallic foil is less than 1 μm, the curling is difficult to prevent, and the composite film is unsuitable for practical use. On the other hand, if the thickness thereof is more than 500 μm, the composite film has a poor flexibility and is unsuitable for use as, for example, an electric circuit board.

Examples of the metallic foil are a copper foil and an aluminum foil. In the case of the copper foil, an electrolytic copper foil, a rolled copper foil, or an electrolytic or rolled copper foil which has been further surface treated with a silane coupling agent or an aluminum-based coupling agent is preferably used in view of the fact that such a foil has a large adhesion to the polyimide layer. In addition, foils of metals such as silver, iron, a nickel/chromium alloy, and stainless steel can also be used. The length of the metallic foil in the above-described polyimide precursor solution is not particularly limited. The width of the metallic foil is generally from about 20 to 200 cm for most practical purposes, but is not limited to the above-specified range. Moreover, the composite film produced using the metallic foil having a width falling within the above-specified range may be cut to a predetermined width at the final step and used.

The same organic polar solvent as used in each of the polymerization reaction to prepare the polyimide precursor can be used as the organic polar solvent used for the preparation of the polyimide precursor solution. The concentration of the polyimide precursor in the solution is from about 10 to 20% by weight. If the concentration is too low, the surface of the polyimide coating becomes rough. On the other hand, if the concentration is too high, the viscosity of the resulting solution increases and the solution becomes difficult to coat. From the standpoint of each coating, the viscosity of the solution at the time of coating is preferably 1,000 poises or less. Further, in order to increase the adhesion between the metallic foil and the polyimide coating, a silane coupling agent may be coated on the metallic foil or may be added to and mixed with the above coating solution.

After the solution is coated on the metallic foil, the coating is dried by heating at a temperature of from 100° to 230° C. for from 30 minutes to 2 hours to remove the solvent. Subsequently the temperature is increased and, finally, the coating is preferably heated at a temperature of from 230° to 600° C. for from 1 minute to 6 hours, and more preferably near the glass transition temperature of the polyimide formed, i.e., from 250° to 350° C. for from 10 minutes to 6 hours to thereby complete the imidation reaction and simultaneously remove the solvent and release the stress formed in the polyimide coating during the imidation reaction.

If the heat treatment to achieve the imidation and release the stress is carried out at temperatures below 230° C., release of the stress is insufficient and the composite film tends to curl. On the other hand, if the heat treatment is carried out at temperatures more than 600° C., the polyimide is decomposed. In order to prevent the decomposition of the polyimide, it is preferred that the heating time at temperatures more than 350° C. be controlled to less than 10 minutes.

The above heat-drying process and high-temperature heat treatment are carried out in the state that the metallic foil with the polyimide precursor solution coated thereon is fixed. The fixing methods of the metallic foil include various procedures which can substantially fix the metallic foil in both the widthwise and lengthwise directions depending on the length and size of the metallic foil, for example, a method in which the metallic foil is fixed to a glass plate in a flat-plate form by using a polyimide tape, and a method in which the metallic foil is fixed by winding both lengthwise extremities of the metallic foil around a cylinder.

After the above heat-drying process and high-temperature heat treatment, the metallic foil with the polyimide coating is cooled to room temperature. The fixation may be removed any time after the high-temperature heat treatment. It is preferred that the fixation be removed after the metallic foil with the polyimide coating is cooled to room temperature.

The polyimide coating wherein the stress is released satisfactorily is formed on the metallic foil. The thickness of the polyimide coating is from 5 to 200 $\mu$m, preferably from 10 to 100 $\mu$m, and more preferably from 10 to 50 $\mu$m. If the thickness of the polyimide layer is less than 5 $\mu$m, the composite film has poor film characteristics. On the other hand, if the thickness is more than 200 $\mu$m, it is difficult to prevent the curling, and the composite film has poor flexibility and is unsuitable for use as an electric circuit board.

The polyimide coating generally has an average coefficient of linear thermal expansion at the temperature range of from 50° to 250° C. in the range of from $1.2 \times 10^{-5}$ to $2.9 \times 10^{-5}$/°C. It is possible to decrease the average coefficient of linear thermal expansion. On the other hand, the average coefficient of linear thermal expansion of the metallic foil having a thickness of from 1 to 500 $\mu$m as determined for the same temperature range as above is in the range of from $1.5 \times 10^{-5}$ to $1.7 \times 10^{-7}$/°C. for a copper foil and in the range of from $2.4 \times 10^{-5}$ to $2.6 \times 10^{-5}$/°C. for an aluminum foil.

The present invention thus preferably has the characteristic that the difference in average coefficient of linear thermal expansion between the polyimide coating and the metallic foil within the above-described temperature range can be controlled within $0.3 \times 10^{-5}$/°C. or less by appropriately selecting the thickness of each of the polyimide coating and the metallic foil, and the polymer composition of the polyimide coating within the above-specified ranges.

The coefficient of linear thermal expansion is represented by:

$$\Delta l / l$$

wherein $l$ is a length of a material at a temperature T and $\Delta l$ is a change in length by the 1° C. temperature change. The average coefficient of linear thermal expansion is defined as an average value of coefficients of linear thermal expansion within a given temperature range. The coefficient of linear thermal expansion is measured as follows:

The composite film is cut to form a test piece having a length of 25 mm and a width of 3 mm. One extremity in lengthwise direction of the test piece is fixed as an upper extremity, and a load of 15 g/mm² is applied to the lower extremity with a distance between chucks of 10 mm. In this condition, the test piece is placed in a nitrogen gas atmosphere and the temperature is changed at a temperature-raising rate of 10° C./min.

The thus-produced polyimide/metallic foil composite film has a curvature radius of at least 25 cm, preferably at least 50 cm, and more preferably $\infty$ in both the widthwise and lengthwise directions, and is substantially free from curling. Moreover, the composite film has excellent heat resistance, chemical resistance, durability, and flexibility, and also has an excellent adhesion between the polyimide coating and the metallic foil. Therefore, the composite film can be suitably used as a printed wiring substrate, a flexible printed wiring substrate, a multi-layer wiring substrate, or an oscillation plate. Even if the composite film is subjected to a processing treatment in which the film is generally heated to a temperature of from 50° to 270° C., the film is substantially free from curling after cooling. Thus, the composite film of the present invention has excellent handling properties and dimensional stability.

The present invention is described in greater detail by reference to the following examples.

The curvature radius and the average coefficient of linear thermal expansion were measured and calculated in the same manner as described above, using test pieces cut off from composite films produced in each of the examples and comparative examples. The curvature radius was measured in both the lengthwise and widthwise directions of a 10 × 10 cm test piece and the values measured were substantially equal to each other.

EXAMPLE 1

10.8 g (0.1 mol) of p-phenylenediamine and 210 g of N-methyl-2-pyrrolidone (hereinafter abbreviated to "NMP") was introduced into a 500 ml flask to dissolve in the diamine in the NMP. To the resulting solution was gradually added 29.4 g (0.1 mol) of 3,3',4,4'-biphenyltetracarboxylic dianhydride while stirring. During this period, the reaction system was cooled with ice water so that the temperature did not exceed 30° C. Thereafter, the mixture was stirred for 2 hours to prepare a 16.1% by weight NMP solution of polyamide acid. The logarithmic viscosity of the polyamide acid (measured at 30° C. in NMP at a concentration of 0.5 g/100 ml) was 2.32. The viscosity of the NMP solution wa 1,820 poises (30° C.).

The NMP solution of polyamide acid was heated to decrease the viscosity to 1,000 poises or less and flow coated by an applicator which can adjust the coating thickness on a 35 $\mu$m thick copper foil having a size of from 30 cm × 20 cm which had been fixed to a glass plate of the same size as that of the copper foil with a polyimide film at all the extremities and heated at 150° C. for 30 minutes, at 200° C. for 60 minutes, and then at 270° C. for 2 hours. The composite film was cooled to room temperature and the fixation of the copper foil was removed.

The polyimide/copper foil composite film thus-produced had a thickness of the polyimide coating of 24 $\mu$m and a curvature radius of 82 cm, and was substantially free from curling.

The 90° peeling strength between the polyimide layer and the copper foil in this composite film was 1.48 kg/10 mm at room temperature (e.g., 20°-30° C.), and 1.40 kg/10 mm after immersing the composite film in a soldering bath maintained at 260° C. for 30 seconds. Moreover, the composite film did not curl even if pattern etching was applied thereon.

The coefficient of linear thermal expansion of the polyimide layer in the composite film was measured by a thermal mechanical analysis (hereinafter abbreviated to "TMA"). The average coefficient of linear thermal expansion at the temperature of 50° to 250° C. was $1.62 \times 10^{-5}/°C.$, and this value was nearly equal to the average coefficient of linear thermal expansion $(1.60 \times 10^{-5}/°C.)$ of the copper foil at the same temperature range as above.

EXAMPLES 2 to 5

The NMP solution of polyamide acid as prepared in Example 1 was flow coated in the same manner as in Example 1 on a 35 μm thick copper foil of the same size as in Example 1, which had been fixed on a glass plate of the same size as the copper foil in the same manner as in Example 1, heated at 150° C. for 30 minutes and at 200° C. for 60 minutes, then heated under the conditions shown in Table 1, followed by cooling to produce a polyimide/copper foil composite film in which the thickness of the polyimide coating was 24 μm. The curvature radius of the composite film is shown in Table 1. The curvature radius of the composite film produced in Example 1 is also shown in Table 1.

TABLE 1

| Run No. | Heating Condition Temperature (°C.) | Time (hours) | Curvature Radius (cm) |
|---|---|---|---|
| Example 2 | 230 | 12 | 25 |
| Example 3 | 250 | 6 | 56 |
| Example 1 | 270 | 2 | 82 |
| Example 4 | 280 | 2 | ∞ |
| Example 5 | 300 | 1 | ∞ |

COMPARATIVE EXAMPLE 1

A 19.0 wt% NMP solution of polyamide acid was prepared in the same manner as in Example 1 except that 20.0 g (0.1 mol) of 4,4'-diaminodiphenyl ether was used in place of 10.8 g (0.1 mol) of p-phenylenediamine. The logarithmic viscosity of the polyamide acid (measured at 30° C. in NMP at a concentration of 0.5 g/100 ml) was 2.12, and the viscosity of the NMP solution was 2,040 poises (30° C.).

This NMP solution of polyamide acid was flow coated in the same manner as in Example 1 on a 35 μm thick copper foil of the same size as in Example 1, which had been fixed to a glass plate of the same size as the copper foil in the same manner as in Example 1, heated under the same conditions as in Example 1, and then cooled to room temperature. The fixation of the copper foil was removed. The polyimide/copper foil composite film thus-produced had a thickness of the polyimide layer of 29 μm and a curvature radius of 0.8 cm, and curled greatly.

The average coefficient of linear thermal expansion of the polyimide coating in the composite film measured by the TMA at the temperature range of from 50° to 250° C. was $3.4 \times 10^{-5}/°C.$, and this value was larger than that of the copper foil at the same temperature range as above. For this reason, it is believed that the composite film would curl when cooled to room temperature even if the stress was released at the time of forming the polyimide coating.

COMPARATIVE EXAMPLE 2

The NMP solution of polyamide acid as prepared in Comparative Example 1 was flow coated in the same manner as in Example 1 on a 35 μm thick copper foil of the same size as in Example 1, which had been fixed to a glass plate of the same size as the copper foil in the same manner as in Example 1, heated at 150° C. for 30 minutes, at 200° C. for 60 minutes and at 300° C. for 1 hours, and then cooled to room temperature. The fixation of the copper foil was removed. The polyimide/copper foil composite film thus-produced had a thickness of the polyimide coating of 24 μm and a curvature radius of 1.1 cm, and curled greatly.

EXAMPLES 6 to 9

A 500 ml flask was charged with a solvent and a diamine component as shown in Table 2, and the diamine component was dissolved in the solvent. The amount of the solvent used was such that the concentrations of the diamine and aromatic tetracarboxylic acid components were each 15% by weight.

To the solution thus prepared was gradually added an aromatic tetracarboxylic acid component as shown in Table 2 while stirring. During this period, the reaction system was cooled with ice water so that the temperature did not exceed 30° C. The mixture was then stirred for a certain time to prepare a polyamide acid solution having a logarithmic viscosity (measured at 30° C. in NMP at a concentration of 0.5 g/100 ml), as shown in Table 2.

The polyamide acid solution thus-prepared was flow coated in the same manner as in Example 1 onto a copper foil having the same size as in Example 1 and a thickness as shown in Table 2, which had been fixed to a glass plate of the same size as the copper foil in the same manner as in Example 1, heated at 150° C. for 30 minutes, at 200° C. for 60 minutes and at 300° C. for 2 hours, and then cooled to room temperature. The fixation of the copper foil was removed. The thickness of the polyimide layer and the curvature radius of the composite film were as shown in Table 2. The difference between the polyimide coating and the copper foil in the average coefficient of linear thermal expansion measured by TMA in the temperature range of from 50° to 250° C. is shown in Table 2.

COMPARATIVE EXAMPLES 3 to 7

Polyamide acid solutions having a logarithmic viscosity (measured at 30° C. in NMP at a concentration of 0.5 g/100 ml) as shown in Table 2 were prepared using solvents, diamine components, and aromatic tetracarboxylic acid components as shown in Table 2 in the same manner as in Examples 6 to 9.

These polyamide acid solutions were used to produce polyimide/copper foil composite films in the same manner as in Examples 6 to 9. These composite films were measured for the curvature radius, the thickness of each of the copper foil and polyimide coating, and the difference between the copper foil and the polyimide layer in the average coefficient of linear thermal expansion was measured in the temperature range of from 50° to 250° C. The results obtained are shown in Table 2.

In Table 2, the abbreviations are as follows.

p-PDA: p-phenylenediamine,
m-PDA: m-phenylenediamine,
DADE: 4,4'-diaminodiphenyl ether,
DADM: 4,4'-diaminodiphenylmethane,
S-BPDA: 3,3',4,4'-biphenyltetracarboxylic dianhydride
PDA: pyrromellitic dianhydride,
BTDA: 3,3',4,4'-benzophenonetetracarboxylic dianhydride,
DMF: N,N-dimethylformamide.

TABLE 2

| Run No. | Diamine Component (amount:mol) | | Aromatic Tetracarboxylic Acid Component (amount:mol) | | Solvent | Logarithmic Viscosity | Thickness of Copper Foil ($\mu$m) | Thickness of Polyimide ($\mu$m) | Curvature Radius (cm) | Difference in Average Coefficient of Linear Thermal Expansion (/°C.) |
|---|---|---|---|---|---|---|---|---|---|---|
| Example 6 | p-PDA | (0.1) | s-BPDA<br>PDA | (0.08)<br>(0.02) | DMF | 1.9 | 35 | 14 | 72 | $0.28 \times 10^{-5}$ |
| Example 7 | p-PDA | (0.1) | S-BPDA<br>BTDA | (0.08)<br>(0.02) | DMF | 1.8 | 35 | 12 | 92 | $0.20 \times 10^{-5}$ |
| Example 8 | p-PDA<br>DADE | (0.08)<br>(0.02) | S-BPDA | (0.1) | NMP | 2.2 | 35 | 22 | 88 | $0.21 \times 10^{-5}$ |
| Example 9 | p-PDA<br>m-PDA | (0.08)<br>(0.02) | s-BPDA | (0.1) | NMP | 2.3 | 70 | 61 | 91 | $0.14 \times 10^{-5}$ |
| Comparative Example 3 | p-PDA<br>DADE | (0.05)<br>(0.05) | s-BPDA | (0.1) | NMP | 1.9 | 35 | 11 | 5 | $1.4 \times 10^{-5}$ |
| Comparative Example 4 | p-PDA<br>m-PDA | (0.05)<br>(0.05) | PDA | (0.1) | DMP | 2.0 | 35 | 25 | 3 | $1.8 \times 10^{-5}$ |
| Comparative Example 5 | p-PDA<br>DADM | (0.05)<br>(0.05) | BTDA | (0.1) | DMF | 1.7 | 35 | 36 | 1.6 | $2.2 \times 10^{-5}$ |
| Comparative Example 6 | DADE | (0.1) | PDA | (0.1) | NMP | 2.1 | 70 | 41 | 0.8 | $2.6 \times 10^{-5}$ |
| Comparative Example 7 | DADE | (0.1) | BTDA | (0.1) | DMF | 1.6 | 70 | 31 | 0.6 | $2.4 \times 10^{-5}$ |

EXAMPLE 10

An NMP solution of polyamide acid was prepared in the same manner as in Example 1, except that 9.73 g (0.09 mol) of p-phenylenediamine and 2.0 g (0.01 mol) of 4,4'-diaminodiphenyl ether was used as the diamine component. The logarithmic viscosity of the polyamide acid (measured at 30° C. in NMP at a concentration of 0.5 g/100 ml) was 2.1.

The above-prepared NMP solution of polyamide acid was flow coated in the same manner as in Example 1 on a 5 $\mu$m thick aluminum foil of the same size as in Example 1, which had been fixed to a glass plate of the same size as the aluminum foil in the same manner as in Example 1, heated at 150° C. for 30 minutes, at 180° C. for 60 minutes and at 290° C. for 2 hours, and then cooled to room temperature. The fixation of the aluminum foil was removed. The polyimide/aluminum foil composite film thus-produced had the thickness of the polyimide coating of 26 $\mu$m and the curvature radius of 76 cm.

The average coefficient of linear thermal expansion of the polyimide layer as determined by TMA at the temperature range of from 50° to 250° C. was $2.3 \times 10^{-5}$/°C., and this value was nearly equal to the average coefficient of linear thermal expansion ($2.5 \times 10^{-5}$/°C.) of the aluminum foil at the same temperature range as above.

It can be seen from the above Examples and Comparative Examples that the process of the present invention can produce polyimide/metallic foil composite films which are substantially free from curling.

While the invention has been described in detail and with reference to specific embodiments thereof, it will be apparent to one skilled in the art that various changes and modifications can be made therein without departing from the spirit and scope thereof.

What is claimed is:

1. A process for producing a polyimide/metallic foil composite film having a curvature radius of at least 25 cm and which is substantially free from curling, which comprises:

coating a solution of a polyimide precursor in an organic polar solvent onto a metallic foil having a thickness of from 1 to 500 $\mu$m, said polyimide precursor being prepared by reacting a diamine component comprising p-phenylenediamine with an aromatic tetracarboxylic acid component comprising 3,3',4,4'-biphenyltetracarboxylic dianhydride or a derivative thereof;

drying the resulting coating by heating in the state that the metallic foil is fixed; and heating the coating at a high temperature to produce a polyimide film having a thickness of from 2 to 200 $\mu$m.

2. A process as in claim 1, wherein the logarithmic viscosity of the polyimide precursor (measured at 30° C. in N-methyl-2-pyrrolidone at a concentration of 0.5 g/100 ml) is from 0.4 to 7.0.

3. A process as in claim 2, wherein the logarithmic viscosity is from 1.5 to 3.0.

4. A process as in claim 1, wherein the diamine component comprises 80 mol% or more of p-phenylenediamine and 20 mol% of less of other diamine.

5. A process as in claim 4, wherein the other diamine is selected from the group consisting of 4,4'-diaminodiphenyl ether, 4,4'-diaminodiphenylmethane, 4,4'-diaminodiphenylsulfone, 3,3'-diaminodiphenylsulfone, 4,4'-diaminodiphenylpropane, 1,5-diaminonaphthalene, 2,6-diaminonaphthalene, 4,4'-diaminodiphenylsulfide, 4,4'-di(m-aminophenoxy)diphenylsulfone, 3,3'-di(m-aminophenoxy)diphenylsulfone, 4,4'-di(m-aminophenoxy)diphenylpropane and mixtures thereof.

6. A process as in claim 1, wherein the aromatic tetracarboxylic acid component comprises 70 mol% or more of 3,3',4,4'-biphenyltetracarboxylic dianhydride or its derivative and 30 mol% or less of other aromatic tetracarboxylic dianhydrides or derivatives thereof.

7. A process as in claim 6, wherein the other aromatic tetracarboxylic dianhydrides or derivatives thereof are selected from the group consisting of pyromellitic dianhydride, 3,3',4,4'-benzophenonetetracarboxylic dianhydride, 2,3,6,7-naphthalenetetracarboxylic acid, derivatives thereof and mixtures thereof.

8. A process as in claim 1, wherein the reaction to prepare the polyimide precursor is conducted in an organic polar solvent at a temperature of from 0° to 90° C. for from 1 to 24 hours.

9. A process as in claim 8, wherein the organic polar solvent is selected from the group consisting of N-methyl-2-pyrrolidone, N,N-dimethylacetamide, N,N-dimethylformamide, dimethylsulfoxide, dimethylphosphoamide, m-cresol, p-cresol and p-chlorophenol.

10. A process as in claim 1, wherein the metallic foil is selected from the group consisting of a copper foil and an aluminum foil.

11. A process as in claim 1, wherein the metallic foil has the thickness of 10 to 100 $\mu$m.

12. A process as in claim 1, wherein the drying is conducted at a temperature of from 100° to 230° C. for from 30 minutes to 2 hours.

13. A process as in claim 1, wherein the final heating is conducted at a temperature of from 230° to 600° C. for from 1 minute to 6 hours.

14. A process as in claim 1, wherein the difference in the coefficients of linear thermal expansion between the metallic foil and the polyimide coating is $0.3 \times 10^{-5}$/°C. or less.

* * * * *